(12) United States Patent
Lee

(10) Patent No.: US 9,646,877 B2
(45) Date of Patent: May 9, 2017

(54) SEMICONDUCTOR DEVICE AND METHOD OF MANUFACTURING THE SAME

(71) Applicant: SK hynix Inc., Gyeonggi-do (KR)

(72) Inventor: Nam Jae Lee, Chungcheongbuk-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/981,210

(22) Filed: Dec. 28, 2015

(65) Prior Publication Data

US 2016/0133511 A1 May 12, 2016

Related U.S. Application Data

(62) Division of application No. 13/716,054, filed on Dec. 14, 2012, now abandoned.

(30) Foreign Application Priority Data

Aug. 2, 2012 (KR) ......................... 10-2012-0084691

(51) Int. Cl.

| H01L 21/768 | (2006.01) |
|---|---|
| H01L 29/66 | (2006.01) |
| H01L 27/115 | (2017.01) |
| H01L 29/788 | (2006.01) |
| H01L 27/11524 | (2017.01) |
| H01L 27/11556 | (2017.01) |
| H01L 27/1157 | (2017.01) |

(Continued)

(52) U.S. Cl.
CPC .... *H01L 21/76829* (2013.01); *H01L 21/7681* (2013.01); *H01L 21/76802* (2013.01); *H01L 21/76807* (2013.01); *H01L 21/76811* (2013.01); *H01L 21/76877* (2013.01); *H01L 21/76879* (2013.01); *H01L 27/1157* (2013.01); *H01L 27/11519* (2013.01); *H01L 27/11524* (2013.01); *H01L 27/11556* (2013.01); *H01L 27/11565* (2013.01); *H01L 27/11582* (2013.01); *H01L 29/66825* (2013.01); *H01L 29/788* (2013.01); *H01L 29/7889* (2013.01)

(58) Field of Classification Search
CPC .......... H01L 23/5226; H01L 21/76808; H01L 21/7681; H01L 21/76811; H01L 21/76877; H01L 21/76897; H01L 21/76802; H01L 21/76816
See application file for complete search history.

(56) References Cited

U.S. PATENT DOCUMENTS

| 6,436,763 B1 * | 8/2002 | Huang | H01L 27/10888 257/E21.013 |
|---|---|---|---|
| 6,680,254 B2 * | 1/2004 | Sun | H01L 27/10885 257/E21.657 |

(Continued)

FOREIGN PATENT DOCUMENTS

| CN | 101814508 | 8/2010 |
|---|---|---|
| CN | 102194826 | 9/2011 |

*Primary Examiner* — Matthew Reames
*Assistant Examiner* — John Bodnar
(74) *Attorney, Agent, or Firm* — IP & T Group LLP

(57) ABSTRACT

A semiconductor device includes an interlayer insulating layer having openings, contact plugs formed in lower parts of the openings, wherein the contact plugs include a first conductive layer, and bit lines formed in upper parts of the openings and coupled to the contact plugs, wherein the bit lines include a second conductive layer.

13 Claims, 8 Drawing Sheets

(51) Int. Cl.
*H01L 27/11582* (2017.01)
*H01L 27/11519* (2017.01)
*H01L 27/11565* (2017.01)

(56) References Cited

U.S. PATENT DOCUMENTS

| | | | |
|---|---|---|---|
| 6,734,486 B2 * | 5/2004 | Okumura | H01L 27/10894 257/296 |
| 2007/0010092 A1 | 1/2007 | Zhou et al. | |
| 2008/0293242 A1 * | 11/2008 | Cooney, III | H01L 21/76808 438/656 |
| 2009/0152610 A1 | 6/2009 | Minami et al. | |
| 2012/0049267 A1 * | 3/2012 | Jung | H01L 27/11578 257/324 |

* cited by examiner

SEMICONDUCTOR DEVICE AND METHOD OF MANUFACTURING THE SAME

CROSS-REFERENCE TO RELATED APPLICATION

This application is a division of U.S. patent application Ser. No. 13/716,054 filed on Dec. 14, 2012, which claims priority of Korean patent application number 10-2012-0084691, filed on Aug. 2, 2012. The entire disclosure of the foregoing applications is incorporated herein by reference in its entirety.

BACKGROUND

Field of Invention

Exemplary embodiments of the present invention relate to a semiconductor device and a method of manufacturing the same and, more particularly, to a semiconductor device and a method of manufacturing the same.

Description of Related Art

A semiconductor device includes bit lines for inputting or outputting data to or from memory cells. These bit lines are coupled to a contact region of a substrate through contact plugs.

As overlay margin between contact plugs and bit lines is reduced due to limited cell area resulting from the recent increase in the integration of memory devices, the contact plugs and the bit lines may be misaligned with each other. As a result, a bridge may be formed between neighboring contact plug and bit line, or leakage current may occur therebetween. In addition, an etch stop layer remaining between the bit lines may increase capacitance between the bit lines.

BRIEF SUMMARY

Exemplary embodiments of the present invention relate to a semiconductor device and a method of manufacturing the same preventing misalignment between bit lines and contact plugs and reducing capacitance between the bit lines.

A semiconductor device according to an embodiment of the present invention may include an interlayer insulating layer having openings, contact plugs formed in lower parts of the openings, wherein the contact plugs include a first conductive layer, and bit lines formed in upper parts of the openings and coupled to the contact plugs, wherein the bit lines include a second conductive layer.

A method of manufacturing a semiconductor device according to another embodiment of the present invention may include forming an interlayer insulating layer, forming contact holes by etching the interlayer insulating layer, forming contact plugs by filling lower portions of the contact holes with a first conductive layer, forming bit line trenches over the contact plugs in the interlayer insulating layer and forming bit lines by filling the bit line trenches with a second conductive layer, wherein the bit lines are coupled to the contact plugs inside the interlayer insulating layer.

BRIEF DESCRIPTION OF THE DRAWINGS

FIGS. 1A to 5B are views of a method of manufacturing a semiconductor device according to an embodiment of the present invention, in which FIGS. 1B to 5B are plan views, and FIGS. 1A to 5A are cross-sectional views taken along lines I-I' of FIGS. 1B to 5B, respectively;

DESCRIPTION OF EMBODIMENTS

Figure 1A:
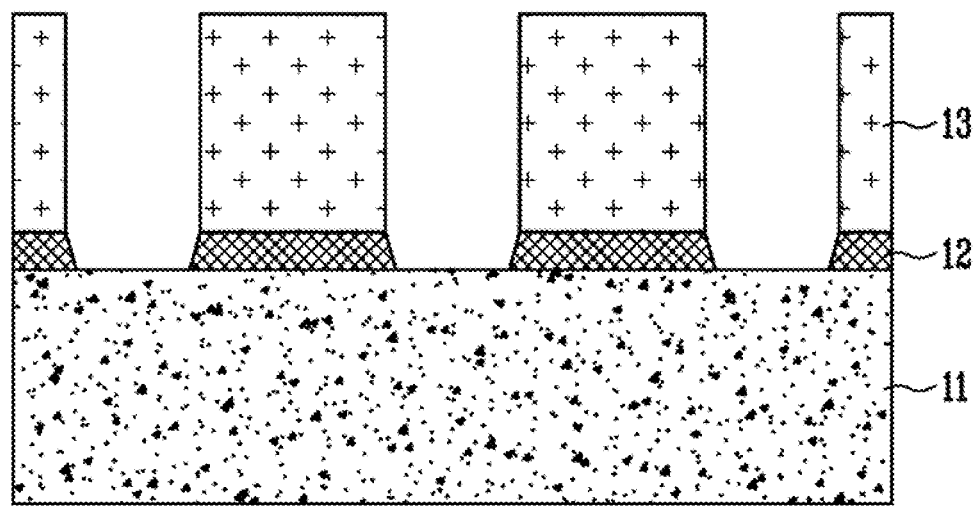

Hereinafter, various embodiments of the present disclosure will be described in detail with reference to the accompanying drawings. In the drawings, a thicknesses and a distance of components are exaggerated compared to an actual physical thickness and interval for convenience of illustration. In the following description, detailed explanation of known related functions and constitutions may be omitted to avoid unnecessarily obscuring the subject manner of the present invention. Like reference numerals refer to like elements throughout the specification and drawings. It should be readily understood that the meaning of "on" and "over" in the present disclosure should be interpreted in the broadest manner such that "on" not only means "directly on" something but also include the meaning of something with an intermediate feature or a layer therebetween, and that "over" not only means the meaning of "over" something may also include the meaning it is "over" something with no intermediate feature or layer therebetween (i.e., directly on something).

Furthermore, 'connected/coupled' represents that one component is directly coupled to another component or indirectly coupled through another component. In this specification, a singular form may include a plural form as long as it is not specifically mentioned in sentence. Furthermore, 'include/comprise' or 'including/comprising' used in the specification represents that one or more components, steps, operations, and elements exists or are added.

FIGS. 1A to 5B are views illustrating a method of manufacturing a semiconductor device according to an embodiment of the present invention. FIGS. 1B to 5B are plan views, and FIGS. 1A to 5A are cross-sectional view taken along lines I-I' of FIGS. 1B to 5B, respectively.

Figure 1B:
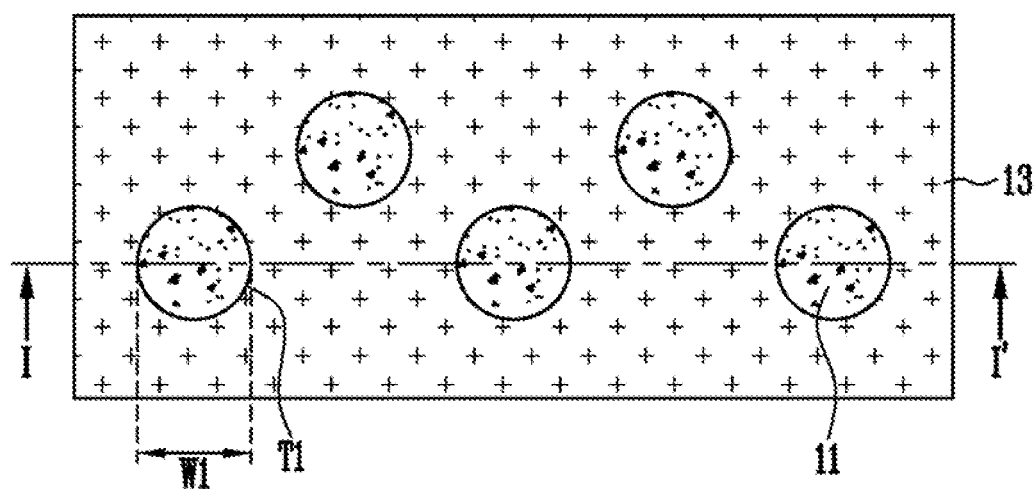

As illustrated in FIGS. 1A and 1B, an interlayer insulating layer 11 is formed over a structure including a given lower structure (not illustrated) such as a gate line. Subsequently, an etch stop layer 12 may be formed on the interlayer insulating layer 11.

Here, the etch stop layer 12 may include a material having a high etch selectivity ratio compared to the interlayer insulating layer 11. For example, the interlayer insulating layer 11 may include an oxide layer, and the etch stop layer 12 may include a nitride layer. In addition, the interlayer insulating layer 11 may have a thickness ranging from about 1500 Å to 3000 Å. The etch stop layer 12 may have a thickness ranging from about 100 Å to 300 Å.

Subsequently, a bit line contact mask pattern 13 may be formed on the etch stop layer 12. Here, the bit line contact mask pattern 13 may include a photoresist pattern.

The bit line contact mask pattern 13 may include first openings T1 for defining positions where bit line contact plugs are formed. Here, the first openings T1 may be hole-type openings with a first width W. In addition, the first openings T1 may be arranged in a single line or in a zigzag pattern. When the first openings T1 are arranged in a zigzag pattern, a contact region may be reduced.

Subsequently, the etch stop layer 12 may be etched by using the bit line contact mask pattern 13 as an etch barrier.

Figure 2A:
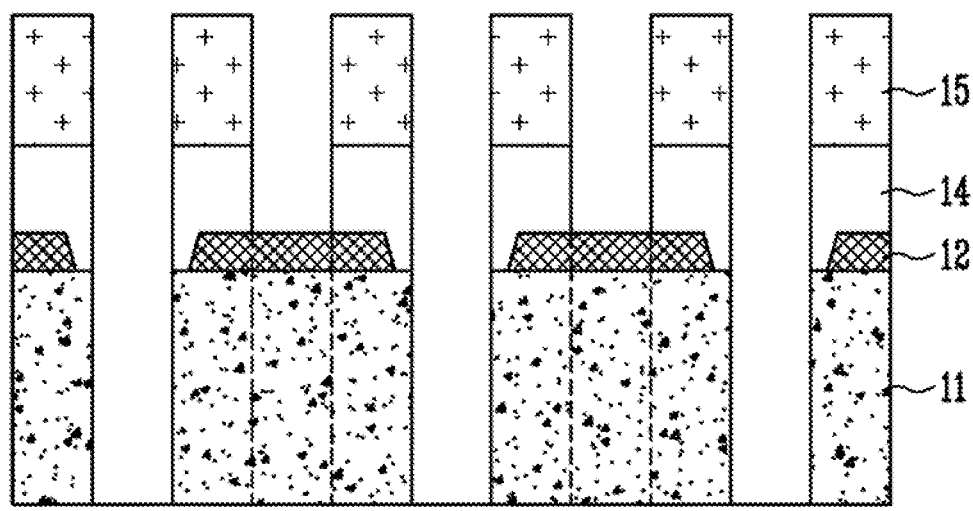
Figure 2B:
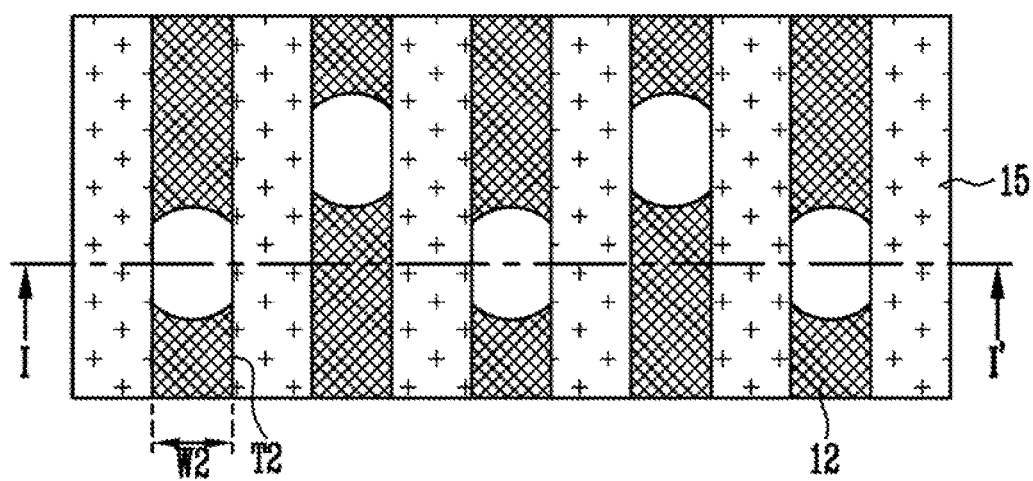

As illustrated in FIGS. 2A and 2B, after the bit line contact mask pattern 13 is removed, a bit fine mask pattern 14 may be formed. For example, a hard mask layer may be formed on the etch stop layer 12 patterned using the bit line contact mask pattern 13. Here, the hard mask layer may include a polysilicon layer having a thickness ranging from about 200 Å to 800 Å. Subsequently, a photoresist pattern 15 may be formed on the hard mask layer to form a bit line mask pattern. Subsequently, the bit line mask pattern 14 may be formed by etching the hard mask layer by using the photoresist pattern 15 as an etch barrier. At this time, a cleaning process may be performed before the hard mask layer is formed after the bit line contact mask pattern 13 is removed.

Here, the bit line mask pattern 14 may have second openings T2 for defining positions where bit lines are subsequently formed. Here, each of the second openings T2 may have a linear shape having a second width W2, and the second width W2 may be equal to or less than the first width W1. Since the first width W1 is equal to or greater than the second width W2, overlay margin may be increased.

Subsequently, contact holes may be formed by etching the interlayer insulating layer 11 by using the bit line mask pattern 14 and the etch stop layer 12 as an etch barrier. At this time, since these contact holes are formed by a self-align etch process, the interlayer insulating layer 11 formed at overlapping areas between the first openings T1 and the second openings T2 may be etched.

In FIGS. 2A and 2B, contact holes formed at the rear side of the cross-section taken along the line are indicated by dotted lines for illustration purposes only.

Subsequently, the photoresist pattern 15 may be removed, and a cleaning process may be performed.

Figure 3A:
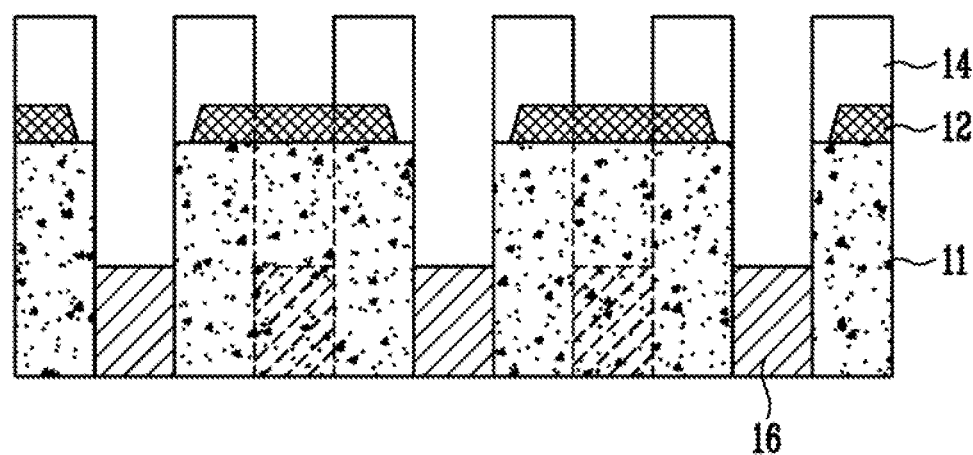
Figure 3B:
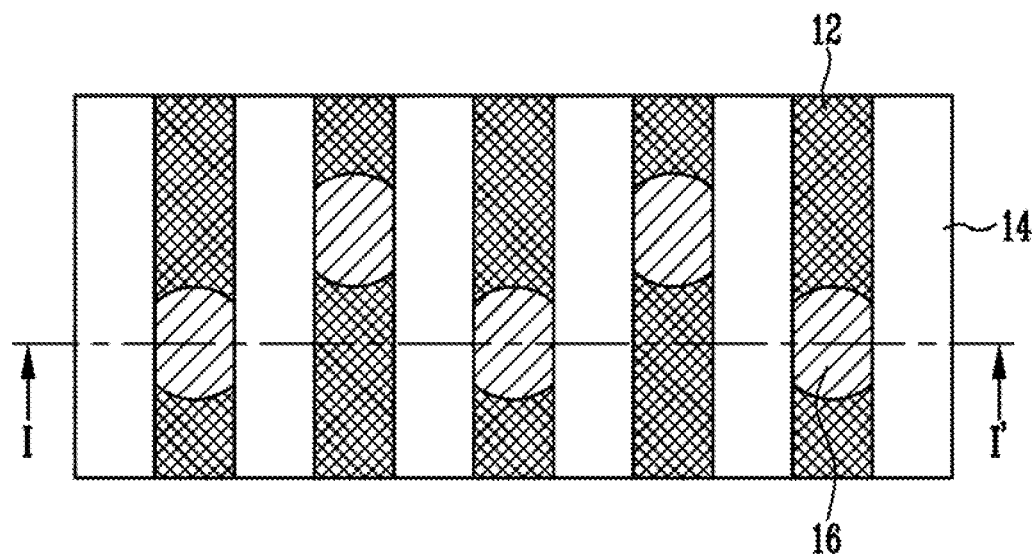

As illustrated in FIGS. 3A and 3B, contact plugs 16 may be formed by filling lower portions of the contact holes with a first conductive layer. For example, the first conductive layer may be formed over the entire structure including the contact holes. Subsequently, the contact plugs 16 that fill the lower portions of the contact holes may be formed by etching back the first conductive layer. Here, through subsequent processes, bit line trenches may be formed in upper portions of the contact holes where the contact plugs 16 are not formed. Therefore, an etch-back process may be performed to control heights of the bit lines.

The contact plugs 16 may include materials with good gap-fill characteristics to fill the contact holes without any voids. For example, each contact plug 16 may include a tungsten layer.

Figure 4A:
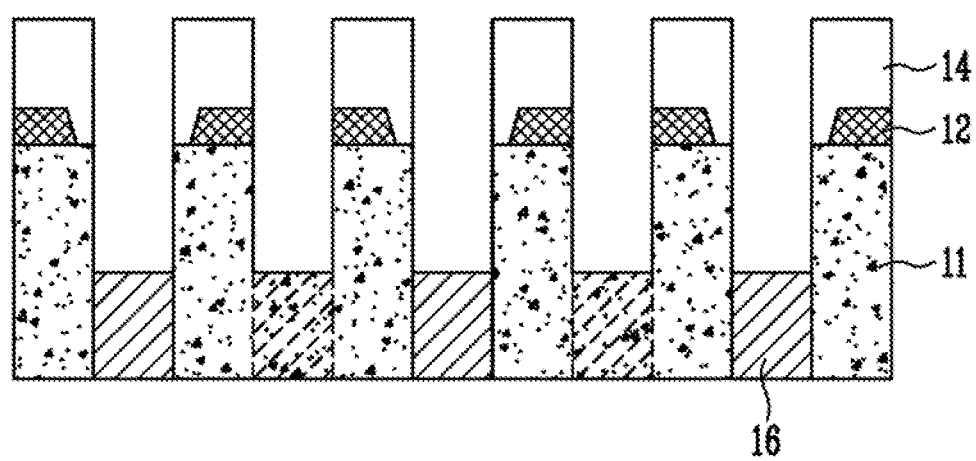
Figure 4B:
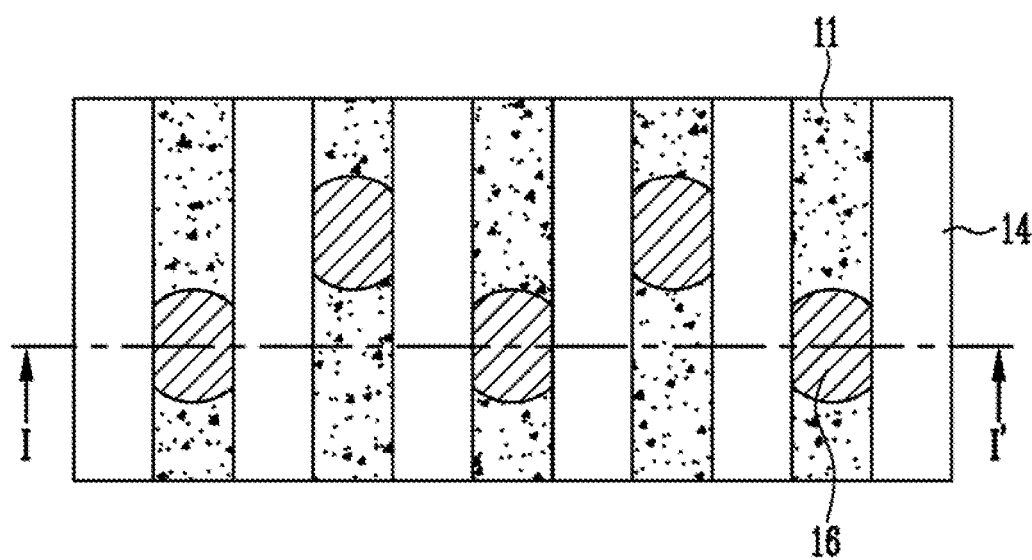

As illustrated in FIGS. 4A and 4B, bit line trenches may be formed by etching the etch stop layer 12 and upper portion of the interlayer insulating layer 11 by using the bit line mask pattern 14 as an etch barrier. At this time, the bit line trenches may be formed to a depth sufficient to expose surfaces of the contact plugs 16.

Figure 5A:
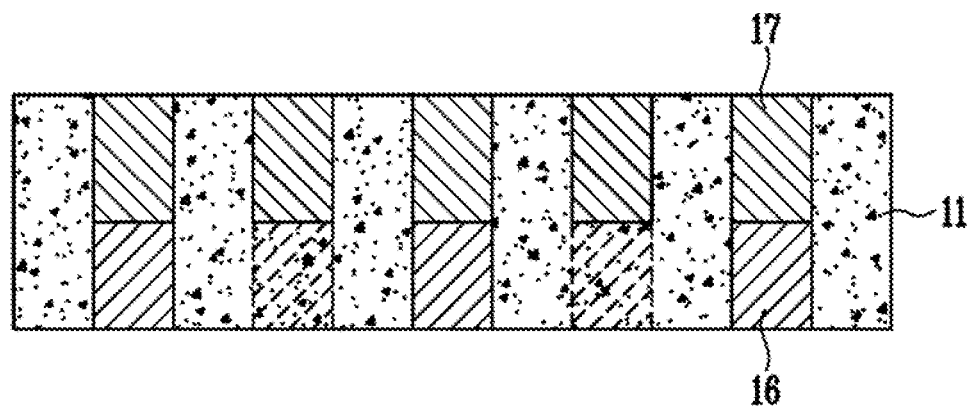
Figure 5B:
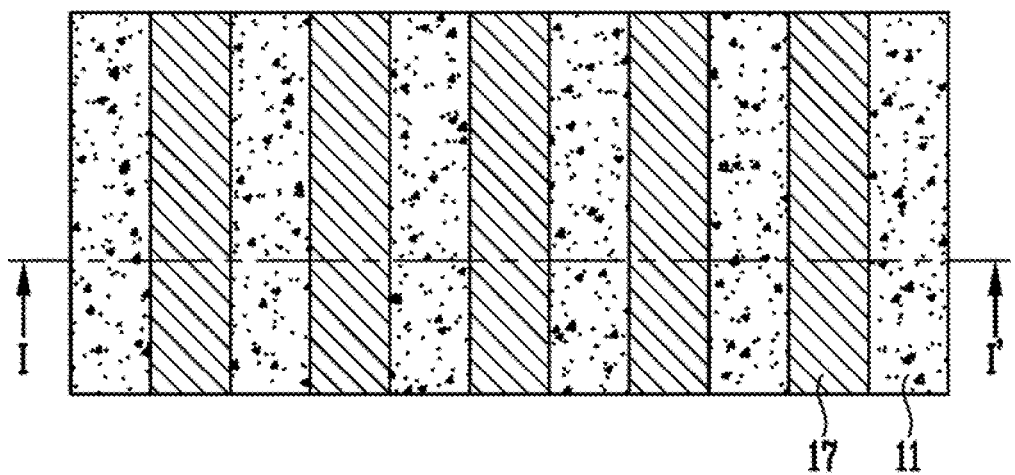

As illustrated in FIGS. 5A and 5B, bit lines 17 may be formed by filling the bit line trenches with a second conductive layer so that the bit lines 17 may be coupled to the contact plugs 16. Here, the bit lines 17 may include materials with low resistance. For example, each bit line 17 may include a copper layer.

As a result, the semiconductor device including the interlayer insulating layer 11 having the openings, the contact plugs 16 formed in lower parts of the openings, and the bit lines formed in upper parts of the openings and coupled to the contact plugs 16 is manufactured. Here, the lower parts of the openings are contact holes, and the upper parts of the openings are bit line trenches.

According to the aforementioned processes, the contact holes may be formed by etching the interlayer insulating layer 11 by using the bit line mask pattern 14 and the etch stop layer 12 as an etch barrier. In addition, the bit line trenches may be formed by etching the etch stop layer 12 and the interlayer insulating layer 11 by using the bit line mask pattern 14 as an etch barrier. In other words, the bit line mask pattern 14 may function as an etch barrier during an etch process for forming the contact holes and an etch process for forming the bit line trenches. As described above, since the contact holes and the bit line trenches are formed using a self-align method, the contact plugs 16 and the bit lines 17 may be prevented from being misaligned with each other.

In addition, since each of the contact plugs 16 may include a tungsten layer, voids may be prevented from being formed in the contact plugs 16, and therefore, the disconnection of the bit lines 17 may be avoided. In addition, since each of the bit lines 17 may include a copper layer, resistance and capacitance of the bit lines 17 may be reduced.

In addition, since the contact plugs 16 and the bit lines 17 are formed in the one interlayer insulating layer 11, the etch stop layer 12 may not remain between the bit lines 17. Since the etch stop layer 12 generally includes a high-dielectric constant material such as a nitride layer, when the etch stop layer 12 remains between the bit lines 17, capacitance between the bit lines 17 may be increased. However, according to the embodiment of the present invention, since the contact plugs 16 may pass through a lower part of the interlayer insulating layer 11, and the bit lines 17 may pass through an upper part of the interlayer insulating layer 11 and be coupled to the contact plugs 16, the etch stop layer 12 may not remain between the bit lines 17. Therefore, the capacitance between the bit lines 17 may be reduced.

Figure 6:
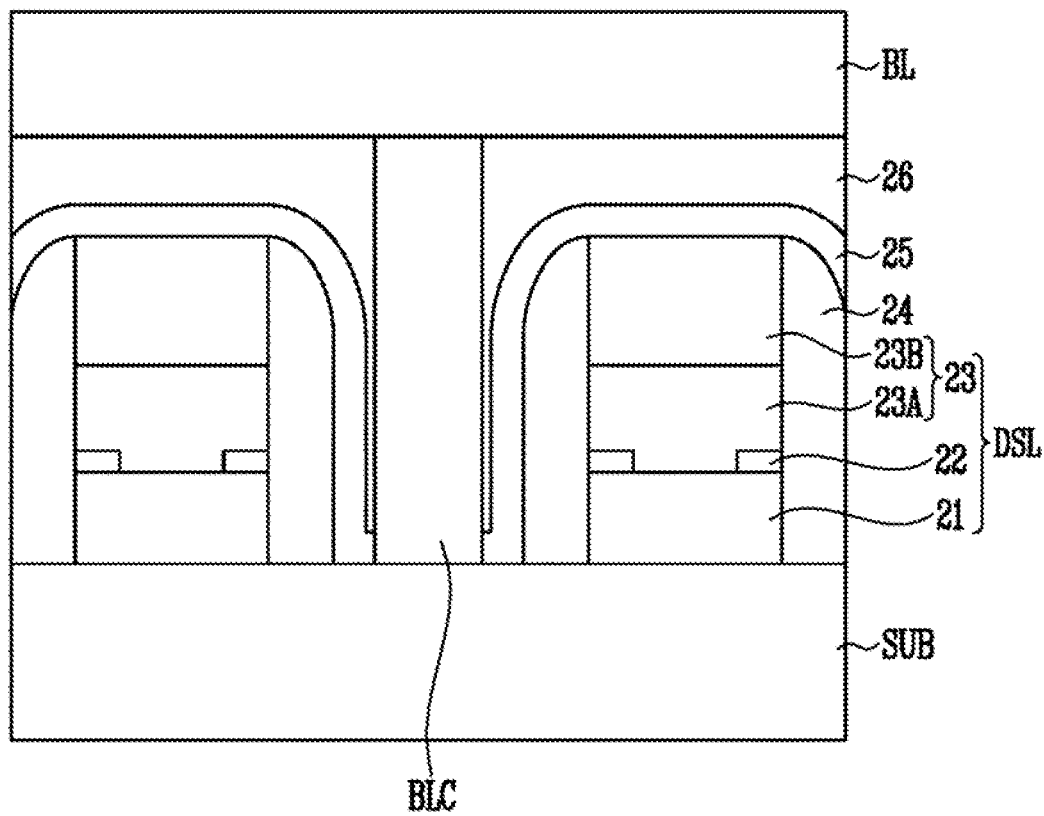
FIG. 6 is a cross-sectional view illustrating non-volatile memory device according to an embodiment of the present invention.

FIG. 6 is a cross-sectional view of a non-volatile memory device according to an embodiment of the present invention.

As illustrated in FIG. 6, a non-volatile memory device according to the embodiment of the present invention may include drain selection lines DSL, a contact region (not illustrated), spacers 24, an etch stop layer 25, an interlayer insulating layer 26, contact plugs BLC and bit lines BL. The drain selection lines DSL may be formed on a substrate SUB. The contact region may be formed by doping a substrate SUB between the drain selection lines DSL with impurities. The spacers 24 may be formed along sidewalls of each of the drain selection lines DSL. The etch stop layer 25 may be formed over the entire surface of the drain selection line DSL along which the spacers 24 are formed. The interlayer insulating layer 26 may be formed on the etch stop layer 25. The contact plugs BLC may pass through the interlayer insulating layer 26. The bit lines BL may be coupled to the contact plugs BLC.

Here, each of the drain selection lines DSL may include a floating gate 21, a dielectric pattern 22 formed on the floating gate 21, and a control gate 23 coupled to the floating gate 21 through an opening of the dielectric pattern 22. The control gate 23 may have a multilayer structure. For example, the control gate 23 may include a polysilicon layer 23A and a metal layer 23B that are stacked.

In addition, the contact plugs BLC and the bit lines BL may be formed using the embodiments described above with reference to FIGS. 1A to 5B. Here, the contact plugs BLC may be formed between neighboring drain selection lines DSL and coupled to the contact region of the substrate SUB. In addition, the contact plugs BLC may be directly coupled to the contact region, or may be coupled to the contact region through separate contact plugs.

Figure 7:
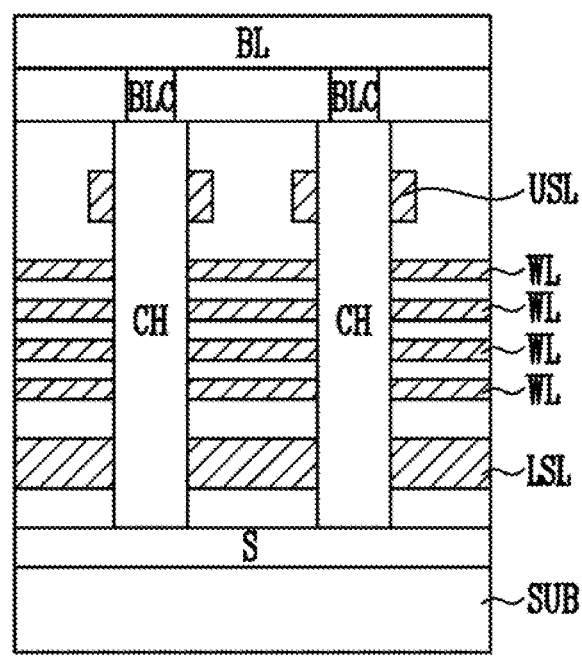
FIGS. 7 to 9 are cross-sectional views illustrating a three-dimensional non-volatile memory device according to an embodiment of the present invention.

FIG. 7 is a cross-sectional view of a three-dimensional non-volatile memory device according to an embodiment of the present invention. For illustration purposes, conductive lines are mainly described, and interlayer insulating layers are not indicated by reference numeral.

As illustrated in FIG. 7, a three-dimensional non-volatile memory device according to an embodiment of the present invention may include channel layers CH, a lower selection line LSL formed in at least one layer, word lines WL formed in a plurality of layers, and an upper selection line USL formed in at least one layer. The channel layers CH may protrude from the substrate SUB including a source region S. The lower selection line LSL, the word lines WL and the upper selection line USL may be stacked along the channel layers CH.

According to the above-described structure, a memory cell may be formed at every intersection between the channel layer CH and the word lines WL. Here, each memory cell may include a memory layer (not illustrated) to store data. The memory layer may include a tunnel insulating layer, a charge storing layer and a charge blocking layer. Here, the charge storing layer may include one of, or a combination of, a floating gate formed of a polysilicon layer storing charge, a trap layer formed of a nitride layer trapping charge, and a nanolayer. Alternatively, the memory layer may include a phase-change material layer instead of the charge storing layer. For example, memory layers may be formed in channel holes while surrounding the channel layers CH, respectively. In another example, a tunnel insulating layer and a charge trap layer may surround the channel layer CH and be formed in each channel hole, and charge blocking layers may have a "U" shape surrounding the word lines WL.

In addition, according to the above-described structure, an upper selection transistor may be formed at every intersection between the channel layer CH and the upper selection line USL formed in at least one layer, and a lower selection transistor may be formed at every intersection between the channel layer CH and the lower selection line LSL formed in at least one layer. Here, the upper selection transistor may serve as a drain selection transistor of a flat type device, and the lower selection transistor may serve as a source selection transistor of the flat device.

The memory device may include the contact plugs BLC and the bit lines BL. The contact plugs BLC may be coupled to top surfaces of the channel layers CH, respectively. The bit lines BL may be coupled to the contact plugs BLC, respectively. Here, since an upper portion of the channel layer CH may function as a channel layer of the upper selection transistor the contact plug BLC may be coupled to the channel layer of the upper selection transistor (drain selection transistor). The contact plugs BLC and the bit lines BL may be formed using the embodiments described above with reference to FIGS. 1A to 5B.

Figure 8:
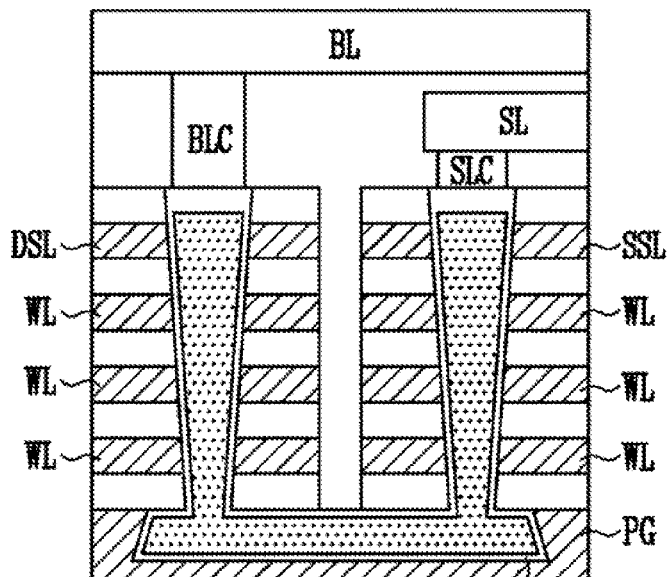

FIG. 8 is a cross-sectional view illustrating a three-dimensional non-volatile memory device according to an embodiment of the present invention. For illustration purposes, conductive lines are mainly described, and interlayer insulating layers are not indicated by reference numeral.

As illustrated in FIG. 8, a three-dimensional non-volatile memory device according to an embodiment of the present invention may include a pipe gate PG, word lines WL, selection lines DSL and SSL and a channel layer CH having a U shape. The word lines WL may be stacked in a plurality of layers over the pipe gate PG. The selection lines DSL and SSL may be stacked in a single layer or a plurality of layers over the word lines WL. The channel layer CH may include a pipe channel layer and first and second channel layers. The pipe channel layer may be formed in the pipe gate PG. The first and second channel layers may be coupled to the pipe channel layer and pass through the word lines WL and the select lines SSL and DSL, respectively.

According to the above-described structure, a memory cell may be formed at every intersection between the channel layer CH and the word lines WL. A drain selection transistor may be formed at every intersection between the channel layer CH and the drain selection line DSL formed in at least one layer. A source selection transistor may be formed at every intersection between the channel layer CH and the source selection line SSL formed in at least one layer. In addition, a pipe transistor may be formed between the channel layer CH and the pipe gate PG.

A memory layer may be formed in each channel hole while surrounding the channel layer CH. In addition, a tunnel insulating layer and a charge trap layer of the memory layer may be formed in each channel hole while surrounding the channel layer CH. Charge blocking layers may have a "U" shape surrounding the word lines WL. The memory layer included in the pipe transistor may function as a gate insulating layer.

In addition, the memory device may include contact plugs SLC and source lines SL. The contact plugs SLC may be coupled to first channel layers passing through the source selection line SSL. The source lines SL may be coupled to the contact plugs SLC, respectively. The memory device may also include contact plugs BLC and the bit lines B. The contact plugs BLC may be coupled to second channel layers passing through the drain selection line DSL. The bit lines BL may be coupled to the contact plugs BLC. Here the contact plugs BLC and the bit lines BL may be formed using the embodiments described above with reference to FIGS. 1A to 5B.

Figure 9:
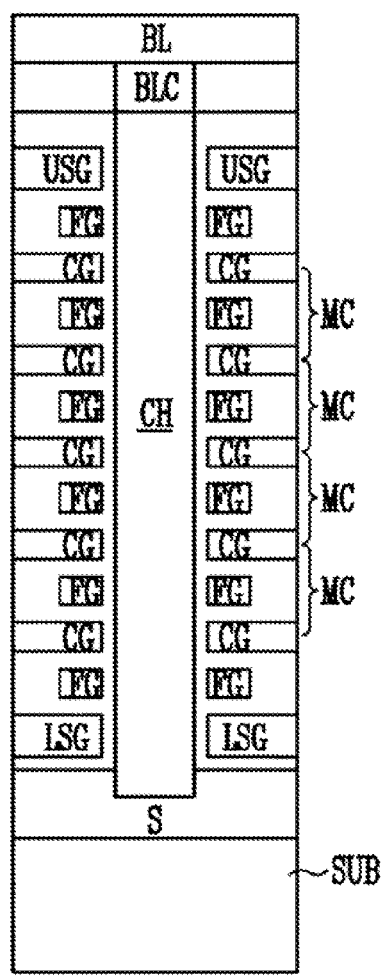

FIG. 9 is a cross-sectional view illustrating a three-dimensional non-volatile memory device according to an embodiment of the present invention. For illustration purposes, conductive lines are mainly described, and interlayer insulating layers are not indicated by reference numeral.

As illustrated in FIG. 9, a three-dimensional non-volatile memory device according to the embodiment of the present invention may include the channel layer CH, a lower selection gate LSG, a plurality of memory cells MC and an upper selection gate USG. The channel layer CH may protrude from the substrate SUB including the source region S. The lower selection gate LSG may surround the channel layer CH and be stacked in at least one layer. The upper selection gate USG may be stacked in at least one layer.

Here, each of the memory cells MC may include a single floating gate FG and two control gates CG. In addition, adjacent memory cells MC stacked in a longitudinal direction may share the same control gates CG. A tunnel insulating layer may be interposed between the channel layer CH and the floating gates FG, and charge blocking layers may be interposed between the floating gates FG and the control gates CG.

In addition, an upper selection transistor may be formed at every intersection between the channel layer CH and the upper selection gate USG. A lower selection transistor may be formed at every intersection between the channel layer CH and the lower selection gate LSG formed in at least one layer. Here, the upper selection transistor may serve as a drain selection transistor of a flat type device, and the lower selection transistor may serve as a source selection transistor of the flat type device.

The memory device may include the contact plugs BLC and the bit lines BL. The contact plug BLC may be coupled to upper portions of the channel layers CH, respectively. The bit lines BL may be coupled to the contact plugs BLC, respectively. Here, since the upper portion of the channel layer CH may function as a channel layer of the upper selection transistor, the contact plug BLC may be coupled to the channel layer of the upper selection transistor (drain selection transistor). The contact plugs BLC and the bit lines BL may be formed using the embodiments described above with reference to FIGS. 1A to 5B.

For reference, in FIG. 9, the channel layer CH may protrude substantially perpendicularly from the substrate SUB in a vertical pillar shape. However, as illustrated in FIG. 8, a U-shaped channel layer may be included. Here, the memory device may further include a pipe channel layer coupling lower portions of the channel layers CH and a pipe gate surrounding the pipe channel layer.

Figure 10:
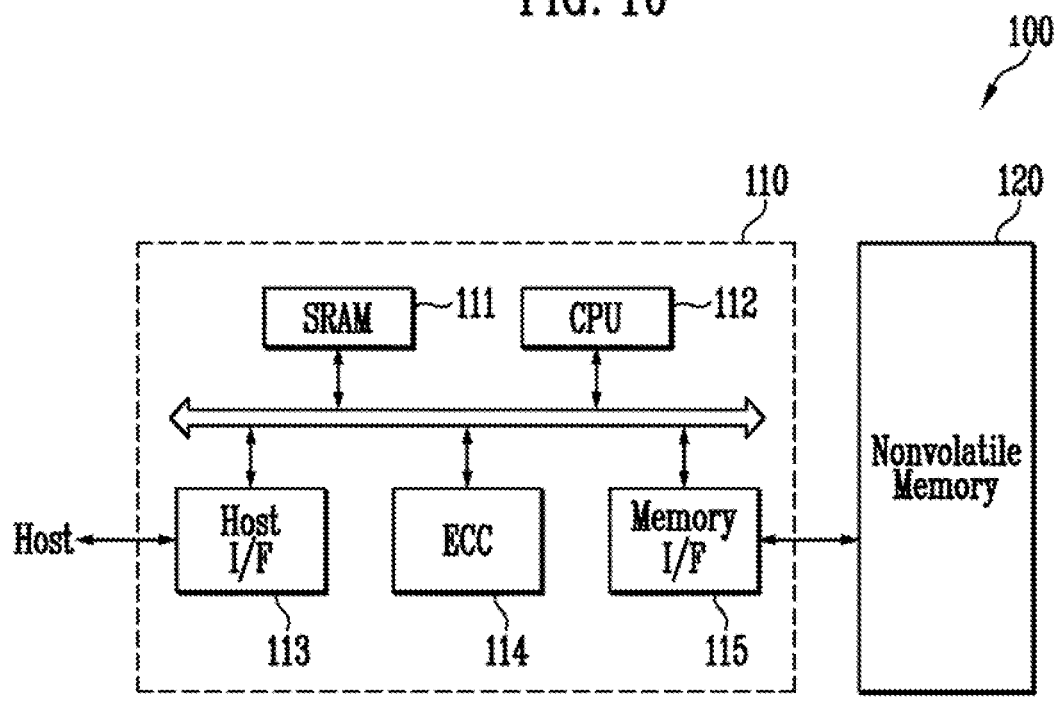
FIG. 10 is a block diagram illustrating the configuration of a memory system according to an embodiment of the present invention.

FIG. 10 is a block diagram illustrating the configuration of a memory system according to an embodiment of the present invention.

As illustrated in FIG. 10, a memory system 100 according to an embodiment of the present invention may include a non-volatile memory device 120 and a memory controller 110.

The non-volatile memory device 120 may have the above-described structure. In addition the non-volatile memory device 120 may be a multi-chip package composed of a plurality of flash memory chips.

The memory controller 110 may be configured to control the non-volatile memory device 120. The memory controller 110 may include SRAM 111, a CPU 112, a host interface 113, an ECC 114 and a memory interface 115. The SRAM 111 may function as an operation memory of the CPU 112. The CPU 112 may perform the general control operation for data exchange of the memory controller 110. The host interface 113 may include a data exchange protocol of a host being coupled to the memory system 100. In addition, the ECC 114 may detect and correct errors included in a data read from the non-volatile memory device 120. The memory interface 115 may interface with the non-volatile memory device 120. The memory controller 110 may further include RCM that stores code data to interface with the host.

The memory system 100 having the above-described configuration may be a solid state disk (SSD) or a memory card in which the memory device 120 and the memory controller 110 are combined. For example, when the memory system 100 is an SSD, the memory controller 110 may communicate with the outside (e.g., a host) through one of the interface protocols including USB, MMC, PCI-E, SATA, PATA, SCSI, ESDI and IDE.

Figure 11:
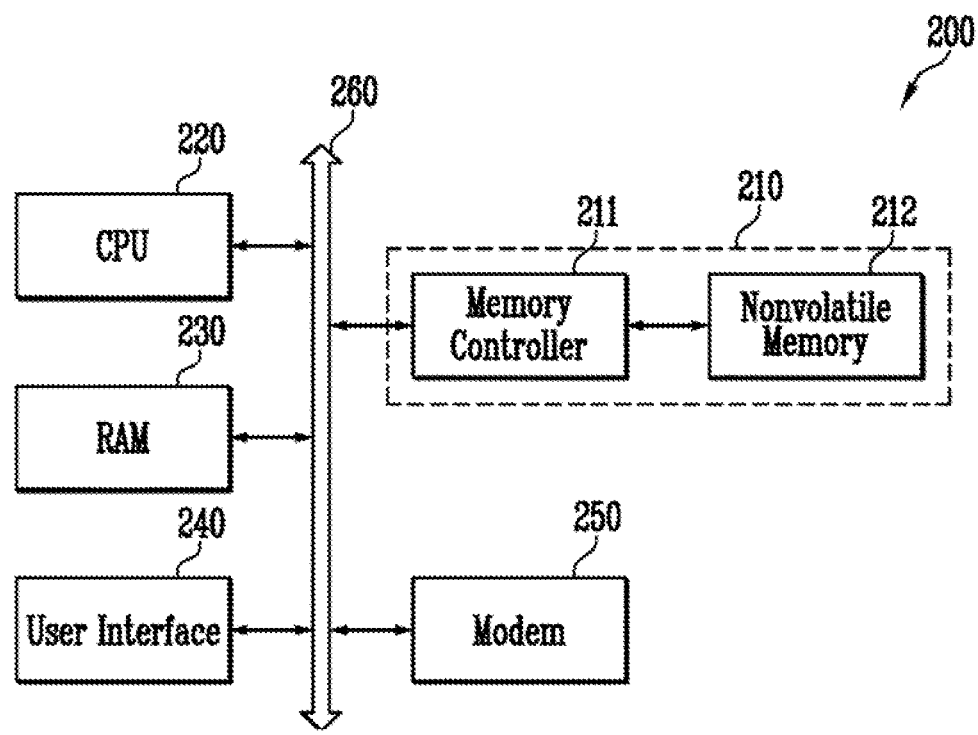
FIG. 11 is a block diagram illustrating the configuration of a computing system according to an embodiment of the present invention.

FIG. 11 is a block diagram illustrating the configuration of a computing system according to an embodiment of the present invention.

As illustrated in FIG. 11, a computing system 200 according to an embodiment of the present invention may include a CPU 220, RAM 230, a user interface 240, a modem 250 and a memory system 210 that are electrically coupled to a system bus 260. In addition, when the computing system 200 is a mobile device, a battery may be further included to apply operating voltage to the computing system 200. The computing system 200 may further include application chip-sets, a Camera Image Processor (CIS) and mobile DRAM.

As described above in connection with FIG. 10 the memory system 210 may include a non-volatile memory 212 and a memory controller 211.

According to an embodiment, since a gate insulating layer of a select transistor is selectively nitrided, a threshold voltage of the select transistor may be controlled, and leakage current may be reduced.

According to embodiments of the present invention, misalignment between bit lines and contact plugs may be prevented, and capacitance between the bit lines may be reduced.

While the present invention has been described with respect to the specific embodiments, it will be apparent to those skilled in the art that various changes and modifications may be made without departing from the spirit and scope of the invention as defined in the following claims.

What is claimed is:

1. A method of manufacturing a semiconductor device, the method comprising:
    forming an interlayer insulating layer;
    forming an etch stop pattern over the interlayer insulating layer, wherein the etch stop pattern includes first openings each having a first width;
    forming a bit line mask pattern on the etch stop pattern having the first openings, wherein the bit line mask pattern includes second openings each having a second width equal to or less than the first width;
    forming contact holes by etching the interlayer insulating layer using the bit line mask pattern and the etch stop pattern as an etch barrier;
    forming contact plugs by filling lower portions of the contact holes with a first conductive layer;
    forming bit line trenches by etching the etch stop pattern and upper portions of the interlayer insulating layer using the bit line mask pattern as an etch barrier, wherein the contact plugs are exposed in the bit line trenches; and
    forming bit lines by filling the bit line trenches with a second conductive layer, wherein the bit lines are coupled to the contact plugs inside the interlayer insulating layer.

2. The method of claim 1, wherein the forming of the etch stop pattern comprises:
    forming an etch stop layer over the interlayer insulating layer;
    forming a bit line contact mask pattern over the etch stop layer; and
    forming the first openings by etching the etch stop layer using the bit line contact mask pattern as an etch barrier.

3. The method of claim 1, further comprising:
    removing the bit line mask pattern and the etch stop pattern before the bit lines are formed.

4. The method of claim 1, wherein the first conductive layer includes a tungsten layer.

5. The method of claim 1, wherein the second conductive layers include a copper layer.

6. The method of claim 1, wherein the etch stop pattern includes a nitride layer.

7. The method of claim 1, wherein the bit line mask pattern includes a polysilicon layer.

8. The method of claim 1, wherein the contact holes and the bit line trenches have substantially the same widths.

9. The method of claim 1, further comprising:
    forming drain selection lines on a substrate before the forming of the interlayer insulating layer; and forming a contact region by doping the substrate between the drain selection lines with impurities.

10. The method of claim 1, further comprising forming at least one lower selection transistor, a plurality of memory cells and at least one upper selection transistor stacked along a channel layer protruding from a substrate before forming the interlayer insulating layer.

11. The method of claim 1, further comprising forming a channel layer, a plurality of memory cells, at least one source selection transistor and at least one drain selection transistor before forming the interlayer insulating layer, wherein the channel layer includes a pipe channel layer formed in a pipe gate and first and second channel layers coupled to the pipe channel layer, the plurality of memory cells are stacked along the first and second channel layers, the at least one source selection transistor is formed over the plurality of memory cells stacked along the first channel layers, and the at least one drain selection transistor is formed above the plurality of memory cells stacked along the second channel layers.

12. The method of claim 1, wherein the contact plugs are formed by completely filling lower portions of the contact holes and the bit lines are formed over the contact plugs.

13. The method of claim 1, wherein the contact plugs and the bit lines have substantially the same widths, and centers of the contact plugs and the bit lines coincide with each other.

* * * * *